(12) United States Patent
Bowyer et al.

(10) Patent No.: US 7,366,047 B2
(45) Date of Patent: Apr. 29, 2008

(54) METHOD AND APPARATUS FOR REDUCING STANDBY CURRENT IN A DYNAMIC RANDOM ACCESS MEMORY DURING SELF REFRESH

(75) Inventors: Stephen Bowyer, Raleigh, NC (US); Jan Zieleman, Cary, NC (US)

(73) Assignee: Infineon Technologies AG, Munich (DE)

( * ) Notice: Subject to any disclaimer, the term of this patent is extended or adjusted under 35 U.S.C. 154(b) by 192 days.

(21) Appl. No.: 11/270,178

(22) Filed: Nov. 9, 2005

(65) Prior Publication Data
US 2007/0104005 A1    May 10, 2007

(51) Int. Cl.
*G11C 7/00* (2006.01)

(52) U.S. Cl. ............... 365/222; 365/203; 365/205; 365/207; 365/208

(58) Field of Classification Search ........... 365/222, 365/203, 205, 207, 208
See application file for complete search history.

(56) References Cited

U.S. PATENT DOCUMENTS

| | | | |
|---|---|---|---|
| 5,280,452 A | 1/1994 | Dhong et al. | |
| 5,825,704 A * | 10/1998 | Shau | 365/222 |
| 5,828,610 A | 10/1998 | Rogers et al. | |
| 6,108,255 A | 8/2000 | Ciraula et al. | |
| 6,108,256 A | 8/2000 | Schneider | |
| 6,205,068 B1 | 3/2001 | Yoon | |
| 6,356,485 B1 * | 3/2002 | Proebsting | 365/222 |
| 6,535,444 B2 | 3/2003 | Jacquet et al. | |
| 6,903,982 B2 * | 6/2005 | Ma et al. | 365/203 |
| 6,914,841 B1 * | 7/2005 | Thwaite | 365/222 |
| 6,930,944 B2 * | 8/2005 | Hush | 365/222 |
| 6,947,346 B2 * | 9/2005 | Shore et al. | 365/222 |
| 7,002,867 B2 * | 2/2006 | Jain | 365/222 |

* cited by examiner

*Primary Examiner*—Trong Phan
(74) *Attorney, Agent, or Firm*—Dicke, Billig & Czaja, PLLC

(57) ABSTRACT

A dynamic random access memory including a first dynamic random access memory cell, a second dynamic random access memory cell to be refreshed, a sense amplifier, and a control circuit. The control circuit is configured to isolate the sense amplifier from at least one of the first dynamic random access memory cell and the second dynamic random access memory cell in an idle state and to couple the sense amplifier to only the second dynamic random access memory cell to be refreshed in a refresh state.

20 Claims, 4 Drawing Sheets

METHOD AND APPARATUS FOR REDUCING STANDBY CURRENT IN A DYNAMIC RANDOM ACCESS MEMORY DURING SELF REFRESH

BACKGROUND

Often, a computer system includes a controller, such as a micro-processor, and one or more memory chips, such as dynamic random access memory (DRAM) chips. The DRAM chips can be any suitable type of DRAM, such as double data rate synchronous DRAM (DDR-SDRAM), graphics DDR-SDRAM (GDDR-SDRAM), low power DDR-SDRAM (LPDDR-SDRAM), reduced latency DRAM (RLDRAM), and pseudo-static RAM (PSRAM) that is based on DRAM. The PSRAM provides advantages in density and speed over traditional static RAM (SRAM).

Typically, a DRAM includes one transistor and one capacitor memory cells arranged in one or more arrays of memory cells, which are arranged in memory banks. Conductive word lines, referred to as row select lines, extend in one direction across an array of memory cells and conductive bit lines, referred to as digit select lines, extend in another direction across the array of memory cells. Memory cells are located at the cross points of word lines and bit lines.

A DRAM includes one or more row decoders, one or more column decoders, and sense amplifiers. To read or write memory cells, the DRAM receives a row address, a column address, and control signals, such as row address select (RAS) and column address select (CAS) signals. A row decoder receives the row address to select a word line or row of memory cells and the row address is latched into the row decoder via the RAS signal. A column decoder receives the column address to select one or more bit lines or columns of memory cells and the column address is latched into the column decoder via the CAS signal. Memory cells at the intersection of the selected row and the selected columns provide data bit values.

The sense amplifiers can be differential sense amplifiers, wherein each sense amplifier receives complementary bit lines at differential inputs. Typically, the complementary bit lines and the sense amplifier are equalized to each other and to an equalization voltage, VBLEQ, during an idle or pre-charge state of the DRAM. The equalization voltage prepares the bit lines and sense amplifier for the next sensing operation. At the sense amplifier, one of the bit lines receives a data bit value from a selected memory cell and the other bit line is used as a reference.

To read the data bit, the sense amplifier amplifies the difference between the data bit value and the reference value and provides a sensed output value to an output driver. The sensed output value is stored back in the selected memory cell at the end of the read operation. To write a data bit into a selected memory cell, input drivers overdrive the sense amplifier. One input driver overdrives a data bit value onto the bit line that is connected to the selected memory cell and another input driver overdrives the inverse of the data bit value onto the reference bit line. Usually, two pairs of bit lines are multiplexed onto the differential inputs of a sense amplifier and an equalization circuit is placed across each pair of complementary bit lines. Often, each of the memory cells is refreshed via a read operation.

Self-refresh mode is an important low power mode in DRAM chips. During an idle state between refresh cycles, both of the equalization circuits are activated and the bit lines on each side of the sense amplifier are connected together and to the sense amplifier to equalize the voltage to VBLEQ. This equalization voltage prepares the bit lines and sense amplifiers for the next refresh. Also, during the idle state the word lines are held at a word line voltage that is usually different than the equalization voltage, VBLEQ.

One of the yield detractors in DRAM production is word line to bit line shorts. The word line to bit line shorts connect the VBLEQ voltage source to the word line voltage source during the idle state, which causes an increase in standby current that may violate current specifications.

For these and other reasons there is a need for the present invention.

SUMMARY

One aspect of the present invention provides a dynamic random access memory including a first dynamic random access memory cell, a second dynamic random access memory cell to be refreshed, a sense amplifier, and a control circuit. The control circuit is configured to isolate the sense amplifier from at least one of the first dynamic random access memory cell and the second dynamic random access memory cell in an idle state and to couple the sense amplifier to only the second dynamic random access memory cell to be refreshed in a refresh state.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
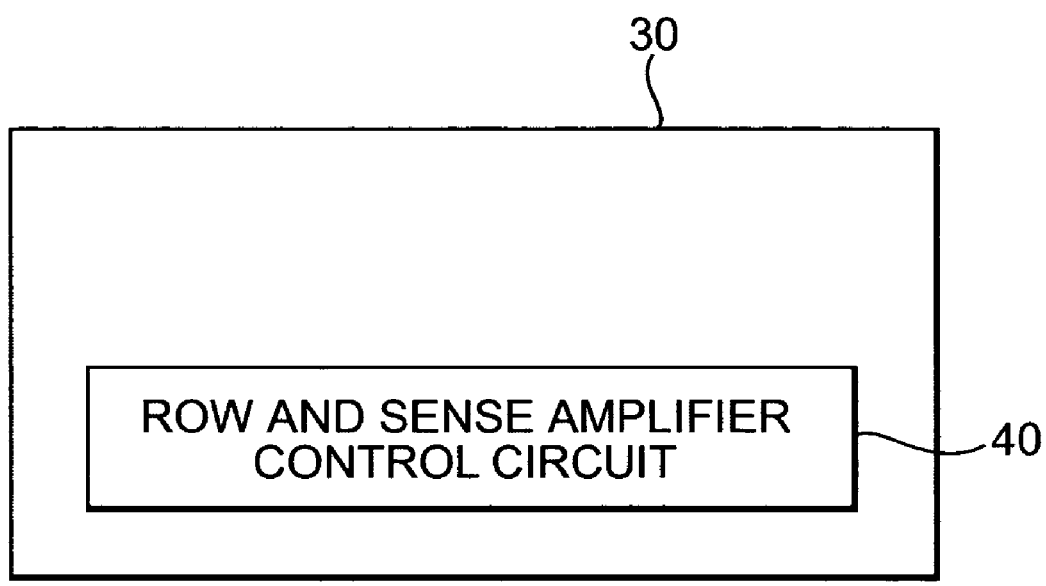
FIG. 1 is a block diagram illustrating one embodiment of a DRAM according to the present invention.

FIG. 1 is a block diagram illustrating one embodiment of a DRAM 30 according to the present invention. DRAM 30 can be any suitable type of DRAM, such as a DDR-SDRAM, GDDR-SDRAM, LPDDR-SDRAM, RLDRAM, and a PSRAM.

DRAM 30 includes a row and sense amplifier control circuit 40 that isolates bit lines from each other and from sense amplifiers during self refresh mode. DRAM 30 includes sense amplifiers that are multiplexed to first bit lines and second bit lines. The first bit lines correspond to first dynamic random access memory cells and the second bit lines correspond to second dynamic random access memory cells. During an idle or pre-charge state, the first bit lines and the second bit lines are pre-charged to an equalization voltage, such as VBLEQ, and row and sense amplifier control circuit 40 isolates the sense amplifiers from at least one of the first bit lines and the second bit lines. Also, during the idle state, row and sense amplifier control circuit 40 isolates the first bit lines from the second bit lines. During a refresh, row and sense amplifier control circuit 40 connects only the set of bit lines, i.e., the first bit lines or the second bit lines, associated with memory cells to be refreshed to sense amplifiers. Row and sense amplifier control circuit 40 controls isolation of bit lines to reduce leakage current due to word line and bit line shorts during the idle state and to maintain standby current within current specifications.

In one embodiment, in the idle state, row and sense amplifier control circuit 40 isolates the sense amplifiers from the first bit lines and connects the sense amplifiers to the second bit lines. Row and sense amplifier control circuit 40 maintains isolation of the sense amplifiers from the first bit lines and maintains the connection of the sense amplifiers to the second bit lines to refresh second dynamic random access memory cells. Row and sense amplifier control circuit 40 connects sense amplifiers to first bit lines and isolates sense amplifiers from second bit lines to refresh first dynamic random access memory cells.

In one embodiment, in the idle state, row and sense amplifier control circuit 40 isolates the sense amplifiers from the first bit lines and the second bit lines. Row and sense amplifier control circuit 40 maintains isolation of the sense amplifiers from the first bit lines and connects sense amplifiers to second bit lines to refresh second dynamic random access memory cells. Row and sense amplifier control circuit 40 maintains isolation of the sense amplifiers from the second bit lines and connects sense amplifiers to first bit lines to refresh first dynamic random access memory cells.

In self refresh mode, row and sense amplifier control circuit 40 provides sense amplifier control signals, multiplexer switch signals, equalization and pre-charge signals, and word line signals to refresh memory cells. In self refresh mode, DRAM 30 periodically addresses and substantially reads each of the memory cells to refresh their data bit values. During a refresh operation, a sense amplifier senses a data bit value stored at a memory cell and amplifies the sensed data bit value to provide the maximum high logic level or the minimum low logic level, whichever was just read, and store the amplified value back in the memory cell.

Figures 2, 3:
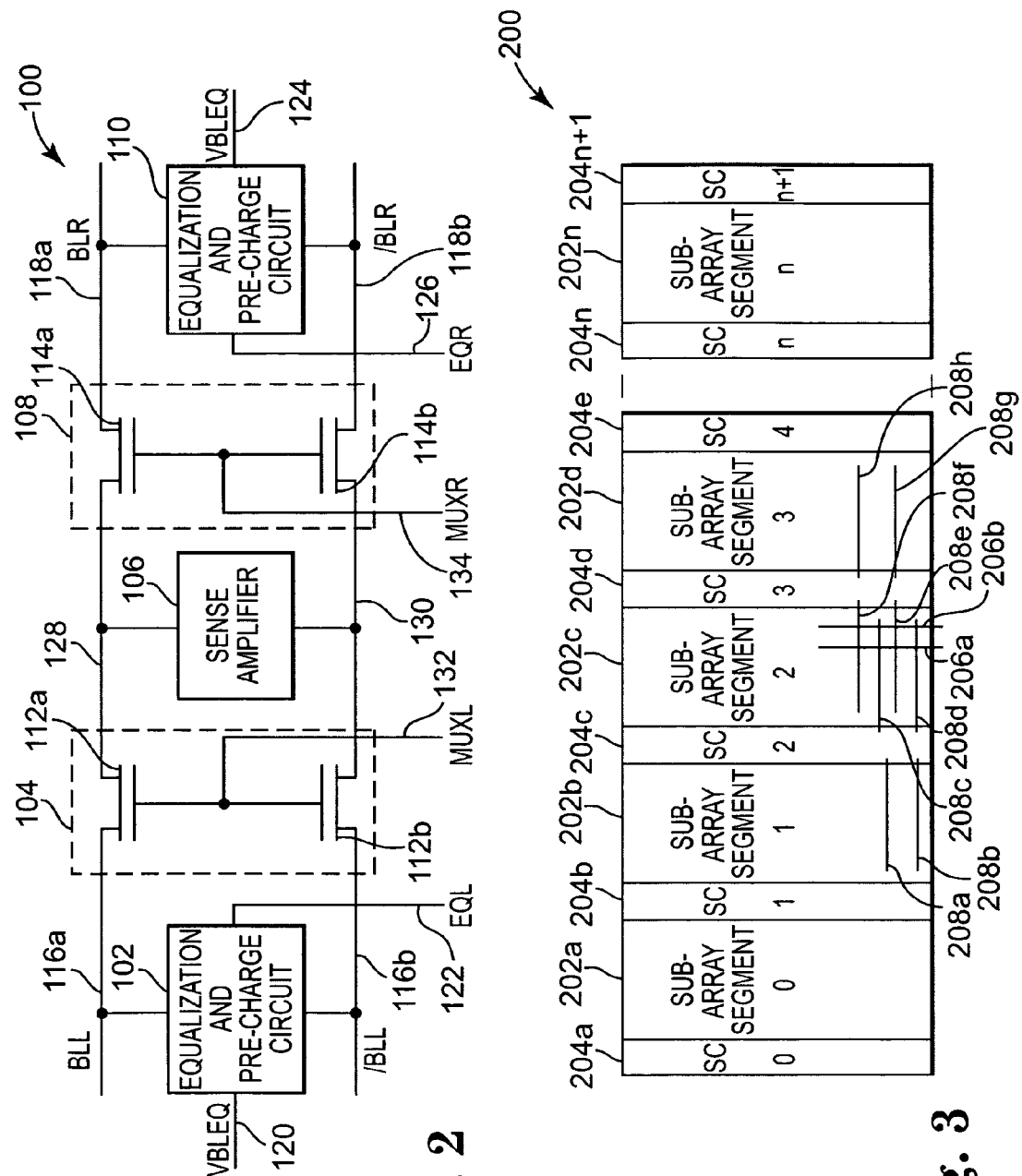
FIG. 2 is a diagram illustrating one embodiment of a multiplexed sense circuit.
FIG. 3 is a diagram illustrating one embodiment of a DRAM array including sub-array segments and sense circuit stripes.

FIG. 2 is a diagram illustrating one embodiment of a multiplexed sense circuit 100. Sense circuit 100 includes a left equalization and pre-charge circuit 102, a left multiplexer switch 104, a sense amplifier 106, a right multiplexer switch 108 and a right equalization and pre-charge circuit 110. Left equalization and pre-charge circuit 102 is electrically coupled to left bit line BLL at 116*a* and left complementary bit line /BLL at 116*b*. Left equalization and pre-charge circuit 102 receives bit line equalization voltage VBLEQ at 120 and a left bit line equalization signal EQL at 122. Right equalization and pre-charge circuit 110 is electrically coupled to right bit line BLR at 118*a* and right complementary bit line /BLR at 118*b*. Right equalization and pre-charge circuit 110 receives the bit line equalization voltage VBLEQ at 124 and a right bit line equalization signal EQR at 126.

Left multiplexer switch 104 includes a left bit line n-channel metal oxide semiconductor (NMOS) isolation transistor 112*a* and a left complementary bit line NMOS isolation transistor 112*b*. Right multiplexer switch 108 includes a right bit line NMOS isolation transistor 114*a* and a right complementary bit line NMOS isolation transistor 114*b*.

One side of the drain-source path of NMOS isolation transistor 112*a* is electrically coupled to left equalization and pre-charge circuit 102 via left bit line BLL at 116*a*. The other side of the drain-source path of NMOS isolation transistor 112*a* is electrically coupled to the first differential input of sense amplifier 106 and one side of the drain-source path of NMOS isolation transistor 114*a* via first differential input path 128. The other side of the drain-source path of NMOS isolation transistor 114*a* is electrically coupled to right equalization and pre-charge circuit 110 via right bit line BLR at 118*a*.

One side of the drain-source path of NMOS isolation transistor 112*b* is electrically coupled to left equalization and pre-charge circuit 102 via the left complementary bit line /BLL at 116*b*. The other side of the drain-source path of NMOS isolation transistor 112*b* is electrically coupled to the second differential input of sense amplifier 106 and one side of the drain-source path of NMOS isolation transistor 114*b* via second differential input path 130. The other side of the drain-source path of NMOS isolation transistor 114*b* is electrically coupled to right equalization and pre-charge circuit 110 via the right complementary bit line /BLR at 118*b*.

The gate of NMOS isolation transistor 112*a* is electrically coupled to the gate of NMOS isolation transistor 112*b* via a left multiplexer control path 132. The gate of NMOS isolation transistor 114*a* is electrically coupled to the gate of NMOS isolation transistor 114*b* via right multiplexer control path 134. The gates of the left isolation transistors 112*a* and 112*b* receive left multiplexer control signal MUXL at 132. The gates of the right isolation transistors 114*a* and 114*b* receive right multiplexer control signal MUXR at 134.

In an idle or standby state, left equalization and pre-charge circuit 102 receives an active left bit line equalization signal EQL at 122 prior to a refresh operation. In response to the active left bit line equalization signal EQL at 122, left equalization and pre-charge circuit 102 equalizes the voltage levels on left bit lines 116*a* and 116*b* to bit line equalization voltage VBLEQ at 120. The left bit line BLL at 116*a* is electrically coupled to left complementary bit line /BLL at 116*b* via the activated left equalization and pre-charge circuit 102. Also, the left bit lines 116*a* and 116*b* are electrically coupled to equalization voltage VBLEQ at 120 via the activated left equalization and pre-charge circuit 102.

During the refresh operation, left equalization and pre-charge circuit 102 receives an inactive left bit line equalization signal EQL at 122. In response to the inactive left bit line equalization signal EQL at 122, left equalization and pre-charge circuit 102 disconnects left bit line BLL at 116*a* from left complementary bit line 116*b*. Also, the deactivated left equalization and pre-charge circuit 102 disconnects the left bit lines 116*a* and 116*b* from equalization voltage VBLEQ at 120.

In the idle or standby state, right equalization and pre-charge circuit 110 receives an active right bit line equalization signal EQR at 126 prior to a refresh operation. In response to the active right bit line equalization signal EQR at 126, right equalization and pre-charge circuit 110 equalizes the voltage levels on right bit lines 118a and 118b to bit line equalization voltage VBLEQ at 124. The right bit line BLL at 118a is electrically coupled to right complementary bit line /BLL at 118b via the activated right equalization and pre-charge circuit 110. Also, the right bit lines 118a and 118b are electrically coupled to equalization voltage VBLEQ at 126 via the activated right equalization and pre-charge circuit 110.

During the refresh operation, right equalization and pre-charge circuit 110 receives an inactive right bit line equalization signal EQR at 126. In response to the inactive right bit line equalization signal EQR at 126, right equalization and pre-charge circuit 110 disconnects right bit line BLL at 118a from right complementary bit line 118b. Also, the deactivated right equalization and pre-charge circuit 110 disconnects the right bit lines 118a and 118b from equalization voltage VBLEQ at 124.

Left multiplexer switch 104 receives an active left multiplexer control signal MUXL at 132 to turn on NMOS isolation transistors 112a and 112b. Turning on NMOS isolation transistors 112a and 112b connects left bit line BLL at 116a to the first differential input at 128 of sense amplifier 106 and left complementary bit line /BLL at 116b to the second differential input at 130 of sense amplifier 106. Deactivating or turning off NMOS isolation transistors 112a and 112b disconnects left bit line BLL at 116a from the first differential input at 128 and left complementary bit line /BLL at 116b from the second differential input at 130.

Right multiplexer switch 108 receives an active right multiplexer control signal MUXR at 134 to turn on NMOS isolation transistors 114a and 114b. Turning on NMOS isolation transistors 114a and 114b connects right bit line BLR at 118a to the first differential input at 128 of sense amplifier 106 and right complementary bit line /BLR at 118b to the second differential input at 130 of sense amplifier 106. Deactivating or turning off NMOS isolation transistors 114a and 114b disconnects right bit line BLR at 118a from the first differential input at 128 and right complementary bit line /BLR at 118b from the second differential input at 130.

In the idle or standby state, at least one of the multiplexer switches 104 and 108 is deactivated via the left multiplexer control signal MUXL at 132 and the right multiplexer control signal MUXR at 134. If a word line is shorted to at least one of the left bit lines 116a and 116b or to at least one of the right bit lines 118a and 118b, deactivating at least one of the multiplexer switches 104 and 108 isolates the left bit line BLL at 116a from the right bit line BLR at 118a and the left complementary bit line /BLL at 116b from the right complementary bit line /BLR at 118b. Also, deactivating at least one of the multiplexer switches 104 and 108 isolates left equalization and pre-charge circuit 102 from right equalization and pre-charge circuit 110, such that only one of the equalization and pre-charge circuits 102 and 110 provides leakage current through a word line to bit line short.

In one embodiment, in the idle state, one of the multiplexer switches 104 and 108 is deactivated and the other one of the multiplexer switches 104 and 108 is activated to charge the first differential input at 128 and the second differential input at 130 to the bit line equalization voltage VBLEQ. In one embodiment, in the idle state, both the left and right multiplexer switches 104 and 108 are deactivated, such that sense amplifier 106 is isolated from providing leakage current through a word line to bit line short.

During the refresh operation, one of the multiplexer switches 104 and 108 is deactivated and the other one of the multiplexer switches 104 and 108 is activated to connect bit lines, such as bit lines 116a and 116b or bit lines 118a and 118b, to the first differential input at 128 and the second differential input at 130. Left multiplexer switch 104 is activated via left multiplexer control signal MUXL at 132 and right multiplexer switch 108 is deactivated via right multiplexer control signal MUXR at 134 to connect left bit line BLL at 116a to the first differential input at 128 and left complementary bit line /BLL at 116b to the second differential input at 130. Left multiplexer switch 104 is deactivated via left multiplexer control signal MUXL at 132 and right multiplexer switch 108 is activated via right multiplexer control signal MUXR at 134 to connect right bit line BLR at 118a to the first differential input at 128 and right complementary bit line /BLR at 118b to the second differential input at 130.

Sense amplifier 106 receives a data bit value at the first differential input at 128 and the inverse of the data bit value or a reference value at the second differential input at 130. To refresh a data bit, sense amplifier 106 amplifies the difference between a sensed value on the first differential input at 128 and a sensed value on the second differential input at 130. The amplified value is stored back into the memory cell via deactivation of a word line.

In one embodiment, in the idle state, sense amplifier 106 is connected to one pair of bit lines, the left bit lines 116a and 116b or the right bit lines 118a and 118b, and isolated from the other pair of bit lines, the right bit lines 118a and 118b or the left bit lines 116a and 116b. The bit lines connected to sense amplifier 106 are charged to the bit line equalization voltage VBLEQ, which charges the first differential input at 128 and the second differential input at 130 to the bit line equalization voltage VBLEQ. In a refresh operation, one of the multiplexer switches, the left multiplexer switch 104 or right multiplexer switch 108, is deactivated and the other is activated to connect a selected memory cell to sense amplifier 106. An activated left multiplexer switch 104 connects the first differential input at 128 to left bit line BLL at 116a and the second differential input at 130 to left complementary bit line /BLL at 116b. An activated right multiplexer switch 108 connects the first differential input at 128 to right bit line BLR at 118a and the second differential input at 130 to left complementary bit line /BLR at 118b. If the deactivated multiplexer switch 104 or 108 was deactivated during the idle state, isolation is maintained between sense amplifier 106 and the isolated pair of bit lines, the right bit lines 118a and 118b or left bit lines 116a and 116b. Also, if the activated multiplexer switch 104 or 108 was activated during the idle state, the connection is maintained between sense amplifier 106 and the connected pair of bit lines, the left bit lines 116a and 116b or right bit lines 118a and 118b. If the activated multiplexer switch 104 or 108 was deactivated during the idle state, a connection is made between left bit lines 116a and 116b and right bit lines 118a and 118b and sense amplifier 106 prior to deactivating the other multiplexer switch 104 or 108 to isolate the one pair of bit lines, the left bit lines 116a and 116b or right bit lines 118a and 118b, from sense amplifier 106.

In one embodiment, in the idle state, sense amplifier 106 is isolated from left bit lines 116a and 116b and right bit lines 118a and 118b. In a refresh operation, one of the multiplexer switches, the left multiplexer switch 104 or right multiplexer switch 108, is deactivated to maintain isolation and the other is activated to connect a selected memory cell to sense amplifier 106. An activated left multiplexer switch 104 connects the first differential input at 128 to left bit line BLL at 116a and the second differential input at 130 to left complementary bit line /BLL at 116b. An activated right multiplexer switch 108 connects the first differential input at 128 to right bit line BLR at 118a and the second differential input at 130 to left complementary bit line /BLR at 118b. The bit lines connected to sense amplifier 106 are charged to the bit line equalization voltage VBLEQ, which charges the first differential input at 128 and the second differential input at 130 to the bit line equalization voltage VBLEQ.

In operation, in the idle state, left equalization and pre-charge circuit 102 receives an active left bit line equalization signal EQL at 122 and right equalization and pre-charge circuit 110 receives an active right bit line equalization signal EQR at 126. In response to the active left bit line equalization signal EQL at 122, left equalization and pre-charge circuit 102 equalizes the voltage levels on left bit lines 116a and 116b to bit line equalization voltage VBLEQ at 120. In response to the active right bit line equalization signal EQR at 126, right equalization and pre-charge circuit 110 equalizes the voltage levels on right bit lines 118a and 118b to bit line equalization voltage VBLEQ at 124.

Also, in the idle state, at least one of the multiplexer switches 104 and 108 is deactivated via the left multiplexer control signal MUXL at 132 and the right multiplexer control signal MUXR at 134. In one embodiment, in the idle state, one of the multiplexer switches 104 and 108 is deactivated and the other one of the multiplexer switches 104 and 108 is activated to charge the first differential input at 128 and the second differential input at 130 to the bit line equalization voltage VBLEQ. During a refresh operation, one of the multiplexer switches 104 or 108 is deactivated and the other is activated to connect a selected memory cell to sense amplifier 106. If the deactivated multiplexer switch 104 or 108 was deactivated during the idle state, isolation is maintained between sense amplifier 106 and the isolated pair of bit lines. Also, if the activated multiplexer switch 104 or 108 was activated during the idle state, the connection is maintained between sense amplifier 106 and the connected pair of bit lines. If the activated multiplexer switch 104 or 108 was deactivated during the idle state, a connection is made between left bit lines 116a and 116b and right bit lines 118a and 118b and sense amplifier 106 prior to deactivating the other multiplexer switch 104 or 108 to isolate one pair of bit lines, the left bit lines 116a and 116b or right bit lines 118a and 118b, from sense amplifier 106. The rest of the refresh operation is provided via sense amplifier 106.

In one embodiment, in the idle state, both the left and right multiplexer switches 104 and 108 are deactivated to isolate sense amplifier 106. In a refresh operation, one of the multiplexer switches 104 or 108 is deactivated to maintain isolation and the other is activated to connect a selected memory cell to sense amplifier 106. The bit lines connected to sense amplifier 106 are charged to the bit line equalization voltage VBLEQ, which charges the first differential input at 128 and the second differential input at 130 to the bit line equalization voltage VBLEQ. The rest of the refresh operation is provided via sense amplifier 106.

FIG. 3 is a diagram illustrating one embodiment of a DRAM array 200 including sub-array segments 202a-202n and sense circuit (SC) stripes 204a-204n+1. Each of the sub-array segments 202a-202n includes dynamic random access memory cells in a sub-array of memory cells. Also, each of the sub-array segments 202a-202n includes bit lines and word lines. Each of the sense circuit stripes 204a-204n+1 include a plurality of sense circuits, such as sense circuit 100.

Each of the sub-array segments 202a-202n is bounded by two of the sense circuit stripes 204a-204n+1. Sub-array segment 0 at 202a is bounded by sense circuit stripe 0 at 204a and sense circuit stripe 1 at 204b. Sub-array segment 1 at 202b is bounded by sense circuit stripe 1 at 204b and sense circuit stripe 2 at 204c. Sub-array segment 2 at 202c is bounded by sense circuit stripe 2 at 204c and sense circuit stripe 3 at 204d. Sub-array segment 3 at 202d is bounded by sense circuit stripe 3 at 204d and sense circuit stripe 4 at 204e, and on, up to sub-array segment n at 202n bounded by sense circuit stripe n at 204n and sense circuit stripe n+1 at 204n+1.

Each of the sense circuit stripes 204b-204n is shared by two of the sub-array segments 202a-202n. Sense circuit stripe 1 at 204b is shared by sub-array segment 0 at 202a and sub-array segment 1 at 202b. Sense circuit stripe 2 at 204c is shared by sub-array segment 1 at 202b and sub-array segment 2 at 202c. Sense circuit stripe 3 at 204d is shared by sub-array segment 2 at 202c and sub-array segment 3 at 202d. Sense circuit stripe 4 at 204e is shared by sub-array segment 3 at 202d and sub-array segment 4, and so on, up to sense circuit stripe n at 204n shared by sub-array segment n-1 and sub-array segment n at 202n. Sense circuit stripe 0 at 204a is used by sub-array segment 0 at 202a and sense circuit stripe n+1 at 204n+1 is used by sub-array segment n at 202n.

Each of the sub-array segments 202a-202n is addressable via the block address portion of a row address. Also, multiplexer switches, such as multiplexer switches 104 and 108, in sense circuit stripes 204b-204n are activated and deactivated via the block address portion of the row address. The multiplexer switches are activated to connect bit lines, such as bit lines 116a and 116b or 118a and 118b, from a selected one of the sub-array segments 202a-202n to sense amplifiers, such as sense amplifier 106. Word lines, such as word lines 206a and 206b, are addressable via the word line address portion of the row address.

In one example operation, a row address is decoded to obtain the block address portion of the row address and select sub-array segment 2 at 202c. Left multiplexer switches, such as left multiplexer switch 104, in sense circuit stripe 2 at 204c are deactivated or turned off to isolate bit lines, such as bit lines 208a and 208b, in sub-array segment 1 at 202b from sense amplifiers in sense circuit stripe 2 at 204c. Right multiplexer switches, such as right multiplexer switch 108, in sense circuit stripe 2 at 204c are activated or turned on to connect bit lines, such as bit lines 208c and 208d, in sub-array segment 2 at 202c to sense amplifiers in sense circuit stripe 2 at 204c. Also, left multiplexer switches, such as left multiplexer switch 104, in sense circuit stripe 3 at 204d are activated or turned on to connect bit lines, such as bit lines 208e and 208f, in sub-array segment 2 at 202c to sense amplifiers in sense circuit stripe 3 at 204d and right multiplexer switches, such as right multiplexer switch 108, in sense circuit stripe 3 at 204d are deactivated or turned off to isolate bit lines, such as bit lines 208g and 208h, in sub-array segment 3 at 202d from sense amplifiers in sense circuit stripe 3 at 204d. One of the word lines, such as word line 206a, is selected via the word line address portion of the row address to refresh selected memory cells in sub-array segment 2 at 202c.

During the idle state, each of the sense circuit stripes 204b-204n includes at least one set of multiplexer switches, left multiplexer switches or right multiplexer switches, which are deactivated to isolate sense amplifiers from bit lines. Also, sense circuit stripe 0 at 204a includes right multiplexers and sense circuit stripe n+1 at 204n+1 includes left multiplexers, which are activated and deactivated similar to left and right multiplexer switches in sense circuit stripes 204*b*-204*n*. In one embodiment, in the idle state, one set of multiplexer switches is deactivated and the other set is activated to charge the first differential inputs and the second differential inputs of sense amplifiers to the bit line equalization voltage VBLEQ. In one embodiment, in the idle state, both the left and right multiplexer switches are deactivated to isolate sense amplifiers.

Figure 4:
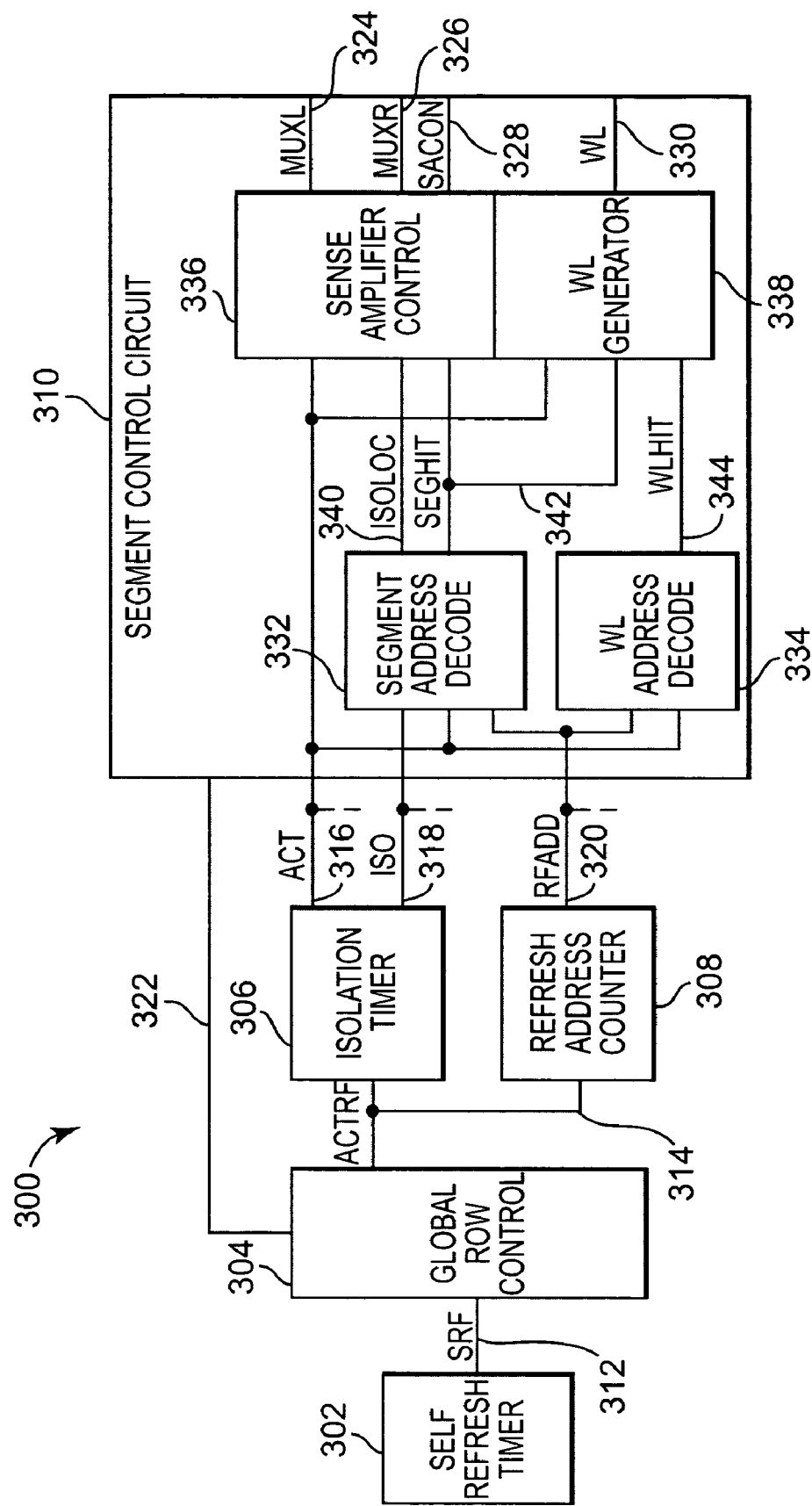
FIG. 4 is a diagram illustrating one embodiment of a row and sense amplifier control circuit.

FIG. 4 is a diagram illustrating one embodiment of a row and sense amplifier control circuit 300. Row and sense amplifier control circuit 300 includes a self refresh timer 302, a global row control circuit 304, an isolation timer 306, a refresh address counter 308, and segment control circuit 310. Row and sense amplifier control circuit 300 includes n segment control circuits 310, wherein each of the n segment control circuits 310 corresponds to one of the sub-array segments 202*a*-202*n*. Row and sense amplifier control circuit 300 is similar to row and sense amplifier control circuit 40.

Self refresh timer 302 is electrically coupled to global row control circuit 304 via timer signal path 312. Global row control circuit 304 is electrically coupled to isolation timer 306 and refresh address counter 308 via row control signal path 314. Isolation timer 306 is electrically coupled to segment control circuit 310 via activation signal path 316 and isolation signal path 318. Refresh address counter 308 is electrically coupled to segment control circuit 310 via refresh address path 320. Segment control circuit 310 is electrically coupled to global row control circuit 304 via segment control path 322.

Self refresh timer 302 provides a self refresh signal SRF at 312 to global row control circuit 304 via timer signal path 312. The self refresh signal SRF at 312 includes self refresh pulses that trigger refresh operations. Each of the self refresh pulses triggers a refresh operation. Self refresh timer 302 triggers refresh operations according to the refresh requirements of DRAM 30.

Global row control circuit 304 receives self refresh signal SRF at 312 including the self refresh pulses and provides a refresh activation signal ACTRF at 314. Global row control circuit 304 provides refresh activation signal ACTRF at 314 to isolation timer 306 and refresh address counter 308 via row control signal path 314. In response to a self refresh pulse, global row control circuit 304 activates refresh activation signal ACTRF at 314. Global row control circuit 304 receives a row activation signal from segment control circuit 310 via segment control path 322. In response to the row activation signal, global row control circuit 304 activates an internal timer to count up to a row address strobe time count. After the internal timer reaches the row address strobe time count, global row control circuit 304 deactivates refresh activation signal ACTRF at 314.

Isolation timer 306 receives refresh activation signal ACTRF at 314 and provides activation signal ACT at 316 and an isolation signal ISO at 318. Isolation timer 306 provides activation signal ACT at 316 to n segment control circuits including segment control circuit 310 via activation signal path 316. Also, isolation timer 306 provides isolation signal ISO at 318 to n segment control circuits including segment control circuit 310 via isolation signal path 318.

Isolation timer 306 activates isolation signal ISO at 318 and an internal timer based on an active refresh activation signal ACTRF at 314. The internal timer counts up to a preconditioning time count. After the internal timer reaches the preconditioning time count, isolation timer 306 activates activation signal ACT at 316, which results in row activation and memory cell refreshing. The time between activating refresh activation signal ACTRF at 314 and activating activation signal ACT at 316 is the preconditioning time. During the preconditioning time, bit lines and differential inputs of sense amplifiers, such as sense amplifier 106, are charged and/or equalized to the bit line equalization voltage VBLEQ.

Isolation timer 306 deactivates activation signal ACT at 316 and activates an internal timer based on a deactivated refresh activation signal ACTRF at 314. The internal timer counts up to a post-conditioning time count. After the internal timer reaches the post-conditioning time count, isolation timer 306 deactivates isolation signal ISO at 318, which ends the refresh operation and substantially begins the idle state. The time between deactivating refresh activation signal ACTRF at 314 and deactivating isolation signal ISO at 318 is the post-conditioning time. During the post-conditioning time, bit lines are charged and equalized to the bit line equalization voltage VBLEQ prior to isolation in the idle state.

Refresh address counter 308 receives refresh activation signal ACTRF at 314 and provides a refresh address RFADD at 320 to n segment control circuits including segment control circuit 310 via refresh address path 320. The refresh address RFADD at 320 includes a block address portion and a word line address portion of a row address.

Segment control circuit 310 receives activation signal ACT at 316, isolation signal ISO at 318, and refresh address RFADD at 320 and provides left multiplexer control signals MUXL at 324, right multiplexer control signals MUXR at 326, sense amplifier control signals SACON at 328, and word line signals WL at 330. Left multiplexer control signals MUXL at 324 and right multiplexer control signals MUXR at 326 control multiplexer switches, such as left multiplexer switch 104 and right multiplexer switch 108, in two of the sense circuit stripes 204*a*-204*n*+1 that bound the one of the sub-array segments 202*a*-202*n* that corresponds to segment control circuit 310. Word line signals WL at 330 activate word lines to turn on memory cells in the sub-array segment 202*a*-202*n* that corresponds to segment control circuit 310. Sense amplifier control signals SACON at 328 control sense amplifier operation. In one embodiment, sense amplifier control signals SACON at 328 control equalization and pre-charge circuits, such as equalization and pre-charge circuits 102 and 110 in the sub-array segment 202*a*-202*n* that corresponds to segment control circuit 310.

Segment control circuit 310 decodes refresh address RFADD at 320. If the block address portion of refresh address RFADD at 320 addresses the sub-array segment 202*a*-202*n* that corresponds to segment control circuit 310, segment control circuit 310 activates left multiplexer control signals MUXL at 324 and right multiplexer control signals MUXR at 326 that correspond to the addressed sub-array segment 202*a*-202*n*. Also, segment control circuit 310 activates a word line addressed via the word line address portion of the row address. Segment control circuit 310 activates the left multiplexer control signals MUXL at 324 and right multiplexer control signals MUXR at 326 based on an active isolation signal ISO at 318. The activated left multiplexer control signals MUXL at 324 and right multiplexer control signals MUXR at 326 turn on multiplexer switches, such as left multiplexer switch 104 and right multiplexer switch 108, to charge and/or equalize bit lines and differential inputs of sense amplifiers to the bit line equalization voltage VBLEQ during the preconditioning time. In one embodiment, segment control circuit 310 deactivates selected left multiplexer control signals MUXL at 324 and right multiplexer control signals MUXR at 326 based on the activated activation signal ACT at 316 to refresh memory cells.

Segment control circuit 310 transmits a row activation signal to global row control circuit 304 in response to the activated activation signal ACT at 316. The global row control circuit 304 activates an internal timer that counts up to a row address strobe time count. After the internal timer reaches the row address strobe time count, global row control circuit 304 deactivates refresh activation signal ACTRF at 314. Isolation timer 306 deactivates activation signal ACT at 316 based on the deactivated refresh activation signal ACTRF at 314. After the post-conditioning time and based on deactivation of isolation signal ISO at 318, segment control circuit 310 deactivates left multiplexer control signals MUXL at 324 and/or right multiplexer control signals MUXR at 326 for the idle state. In one embodiment, based on the deactivated activation signal ACT at 316 and during the post-conditioning time, segment control circuit 310 activates left multiplexer control signals MUXL at 324 or right multiplexer control signals MUXR at 326 to charge and equalize bit lines to the bit line equalization voltage VBLEQ prior to the idle state.

Segment control circuit 310 includes a segment address decode circuit 332, a word line address decode circuit 334, a sense amplifier control circuit 336, and a word line generator 338. Segment address decode circuit 332 is electrically coupled to isolation timer 306 via activation signal path 316 and isolation signal path 318 and to refresh address counter 308 via refresh address path 320. Also, segment address decode circuit 332 is electrically coupled to sense amplifier control circuit 336 via local isolation signal path 340 and segment hit path 342 and to word line generator 338 via segment hit path 342. Sense amplifier control circuit 336 is electrically coupled to isolation timer 306 via activation signal path 316 and provides left multiplexer control signals MUXL at 324, right multiplexer control signals MUXR at 326, and sense amplifier control signals SACON at 328.

Word line address decode circuit 334 is electrically coupled to isolation timer 306 via activation signal path 316 and to refresh address counter 308 via refresh address path 320. Also, word line address decode circuit 334 is electrically coupled to word line generator 338 via word line hit path 344. Word line generator 338 is electrically coupled to isolation timer 306 via activation signal path 316 and provides word lines signals WL at 330.

Segment address decode circuit 332 receives activation signal ACT at 316, isolation signal ISO at 318, and refresh address RFADD at 320 and provides local isolation signal ISOLOC at 340 and segment hit signal SEGHIT at 342. Segment address decode circuit 332 provides local isolation signal ISOLOC at 340 to sense amplifier control circuit 336 via local isolation signal path 340 and segment hit signal SEGHIT at 342 to sense amplifier control circuit 336 via segment hit path 342. Segment address decode circuit 332 decodes the block portion of the row address in refresh address RFADD at 320. If the block portion addresses the sub-array segment 202a-202n serviced via segment control circuit 310, segment address decode circuit 332 provides an active segment hit signal SEGHIT at 342. Otherwise, segment address decode circuit 332 provides an inactive segment hit signal SEGHIT at 342. Also, based on an active isolation signal ISO at 318 and an active segment hit signal SEGHIT at 342, segment address decode circuit 332 provides an active local isolation signal ISOLOC at 340.

Word line address decode circuit 334 receives activation signal ACT at 316 and refresh address RFADD at 320 and provides word line hit signal WLHIT at 344. Word line address decode circuit 334 provides word line hit signal WLHIT at 344 to word line generator 338 via word line hit path 344. Word line address decode circuit 334 decodes the word line portion of the row address in refresh address RFADD at 320 and provides an active word line hit signal WLHIT at 344.

Sense amplifier control circuit 336 receives activation signal ACT at 316, local isolation signal ISOLOC at 340, and segment hit signal SEGHIT at 342 and provides left multiplexer control signals MUXL at 324, right multiplexer control signals MUXR at 326, and sense amplifier control signals SACON at 328. Based on an active local isolation signal ISOLOC at 340 and an active segment hit signal SEGHIT at 342, sense amplifier control circuit 336 activates left multiplexer control signals MUXL at 324 and right multiplexer control signals MUXR at 326 to charge and equalize bit lines and differential inputs of sense amplifiers to the bit line equalization voltage VBLEQ during the preconditioning time. In one embodiment, at the end of the preconditioning time and based on the activated activation signal ACT at 316, sense amplifier control circuit 336 deactivates left multiplexer control signals MUXL at 324 or right multiplexer control signals MUXR at 326 to refresh memory cells.

Word line generator 338 receives activation signal ACT at 316, segment hit signal SEGHIT at 342, and word line hit signal WLHIT at 344 and provides word line signals WL at 330. If segment hit signal SEGHIT at 342 and word line hit signal WLHIT at 344 are active, word line generator 338 activates word line signals WL at 330 based on receiving an active activation signal ACT at 316.

At the end of the row address strobe time, global row control circuit 304 deactivates refresh activation signal ACTRF at 314 and isolation timer 306 deactivates activation signal ACT at 316. Based on the deactivated activation signal ACT at 316, segment address decode circuit 332 deactivates segment hit signal SEGHIT at 342 and word line address decode circuit 334 deactivates word line hit signal WLHIT at 344. In one embodiment, sense amplifier control circuit 336 activates left multiplexer control signals MUXL at 324 and/or right multiplexer control signals MUXR at 326 to charge and equalize bit lines to the bit line equalization voltage VBLEQ prior to entering the idle state.

After the post-conditioning time and based on deactivation of isolation signal ISO at 318, segment address decode circuit 332 deactivates local isolation signal ISOLOC at 340. Based on deactivation of local isolation signal ISOLOC at 340, sense amplifier control circuit 336 deactivates left multiplexer control signals MUXL at 324 or right multiplexer control signals MUXR at 326.

In the idle state, sense amplifier control circuit 336 provides left multiplexer control signals MUXL at 324 and right multiplexer control signals MUXR at 326 to deactivate at least one of the set of left multiplexer switches or the set of right multiplexer switches. In one embodiment, in the idle state, either the left multiplexer switches or the right multiplexer switches are deactivated and the others are activated. In one embodiment, in the idle state, both left multiplexer switches and right multiplexer switches are deactivated. In one embodiment, in the idle state, sense amplifier control circuit 336 provides sense amplifier control signals SACON at 328 to equalize and pre-charge bit lines in sub-array segments 202a-202n.

In operation of one embodiment, in the idle state sense amplifier control circuit 336 activates the left multiplexer control signals MUXL at 324 and left multiplexer switches and deactivates the right multiplexer control signals MUXR at 326 and right multiplexer switches. Also, in the idle state, sense amplifier control circuit 336 provides sense amplifier control signals SACON at 328 to equalize and pre-charge bit lines in sub-array segments 202a-202n.

In self-refresh mode, self refresh timer 302 provides a self refresh pulse in self refresh signal SRF at 312. Global row control circuit 304 receives the refresh pulse in self refresh signal SRF at 312 and activates refresh activation signal ACTRF at 314. Isolation timer 306 receives the activated refresh activation signal ACTRF at 314 and activates isolation signal ISO at 318 and an internal timer that counts up to a preconditioning time count. Refresh address counter 308 receives the activated refresh activation signal ACTRF at 314 and provides a refresh address RFADD at 320 that includes a block address portion and a word line address portion of a row address.

Segment address decode circuit 332 receives the activated isolation signal ISO at 318 and refresh address RFADD at 320. Segment address decode circuit 332 decodes the block portion of the row address in refresh address RFADD at 320. If the block portion addresses the sub-array segment 202a-202n serviced via segment control circuit 310, segment address decode circuit 332 provides an active segment hit signal SEGHIT at 342. Based on the activated isolation signal ISO at 318 and activated segment hit signal SEGHIT at 342, segment address decode circuit 332 provides an active local isolation signal ISOLOC at 340. Also, word line address decode circuit 334 receives refresh address RFADD at 320 and decodes the word line portion of the row address in refresh address RFADD at 320 to provide an active word line hit signal WLHIT at 344.

Sense amplifier control circuit 336 receives the activated local isolation signal ISOLOC at 340 and the activated segment hit signal SEGHIT at 342. Based on the activated local isolation signal ISOLOC at 340 and activated segment hit signal SEGHIT at 342, sense amplifier control circuit 336 activates the right multiplexer control signal MUXR at 326 and right multiplexer switch 108 that corresponds to the addressed sub-array segment 202a-202n. The left multiplexer control signals MUXL remain activated from the idle state. With the left and right multiplexer switches 108 and 104 activated in one of the sense circuits 204a-204n+1 that bound the addressed sub-array segment 202a-202n, bit line voltages and the differential inputs of the sense amplifier 106 are equalized to the bit line equalization voltage VBLEQ during the preconditioning time.

After the internal timer reaches the preconditioning time count, isolation timer 306 activates activation signal ACT at 316. Sense amplifier control circuit 336 receives the activated activation signal ACT at 316 and deactivates the left multiplexer control signal MUXL at 324 and left multiplexer switch 108 in the sense circuit 204a-204n that had both left and right multiplexer switches 108 and 104 activated. Word line generator 338 receives the activated activation signal ACT at 316, the activated segment hit signal SEGHIT at 342, and the activated word line hit signal WLHIT at 344 and activates word line signals WL at 330. Segment control circuit 310 transmits a row activation signal to global row control circuit 304, which activates an internal timer that counts up to a row address strobe time count. Memory cell(s) are refreshed during the row address strobe time.

After the internal timer reaches the row address strobe time count, global row control circuit 304 deactivates refresh activation signal ACTRF at 314. Isolation timer 306 receives the deactivated refresh activation signal ACTRF at 314 and deactivates activation signal ACT at 316. Also, isolation timer 306 activates an internal timer that counts up to a post-conditioning time count.

Segment address decode circuit 332 receives the deactivated activation signal ACT at 316 and deactivates segment hit signal SEGHIT at 342. Also, word line address decode circuit 334 receives the deactivated activation signal ACT at 316 and deactivates word line hit signal WLHIT at 344. Sense amplifier control circuit 336 receives the deactivated activation signal ACT at 316 and deactivated segment hit signal SEGHIT at 342 and activates the left multiplexer control signal MUXL at 324 and left multiplexer switch 104, in the sense circuit 204a-204n that previously had left and right multiplexer switches 108 and 104 activated. This charges and equalizes bit lines and differential inputs of sense amplifier 106 to the bit line equalization voltage VBLEQ prior to entering the idle state.

After the internal timer reaches the post-conditioning time count, isolation timer 306 deactivates isolation signal ISO at 318, which ends the refresh operation and substantially begins the idle state. Based on deactivation of isolation signal ISO at 318, segment address decode circuit 332 deactivates local isolation signal ISOLOC at 340 and sense amplifier control circuit 336 deactivates right multiplexer control signals MUXR at 326 for the idle state.

In operation of another embodiment, in the idle state sense amplifier control circuit 336 deactivates the left multiplexer control signals MUXL at 324 and left multiplexer switches and the right multiplexer control signals MUXR at 326 and right multiplexer switches. Also, in the idle state, sense amplifier control circuit 336 provides sense amplifier control signals SACON at 328 to equalize and pre-charge bit lines in sub-array segments 202a-202n.

In self-refresh mode, self refresh timer 302 provides a self refresh pulse in self refresh signal SRF at 312. Global row control circuit 304 receives the refresh pulse in self refresh signal SRF at 312 and activates refresh activation signal ACTRF at 314. Isolation timer 306 receives the activated refresh activation signal ACTRF at 314 and activates isolation signal ISO at 318 and an internal timer that counts up to a preconditioning time count. Refresh address counter 308 receives the activated refresh activation signal ACTRF at 314 and provides a refresh address RFADD at 320 that includes a block address portion and a word line address portion of a row address.

Segment address decode circuit 332 receives the activated isolation signal ISO at 318 and refresh address RFADD at 320. Segment address decode circuit 332 decodes the block portion of the row address in refresh address RFADD at 320. If the block portion addresses the sub-array segment 202a-202n serviced via segment control circuit 310, segment address decode circuit 332 provides an active segment hit signal SEGHIT at 342. Based on the activated isolation signal ISO at 318 and activated segment hit signal SEGHIT at 342, segment address decode circuit 332 provides an active local isolation signal ISOLOC at 340. Also, word line address decode circuit 334 receives refresh address RFADD at 320 and decodes the word line portion of the row address in refresh address RFADD at 320 to provide an active word line hit signal WLHIT at 344.

Sense amplifier control circuit 336 receives the activated local isolation signal ISOLOC at 340 and the activated segment hit signal SEGHIT at 342 and activates the left multiplexer control signal MUXL at 324 and the right multiplexer control signal MUXR at 326 that correspond to the addressed sub-array segment 202a-202n. The differential inputs of sense amplifiers are equalized to the bit line equalization voltage VBLEQ during the preconditioning time. The preconditioning time may be longer in this embodiment to charge the differential inputs from an unknown value to the bit line equalization voltage VBLEQ.

After the internal timer reaches the preconditioning time count, isolation timer 306 activates activation signal ACT at 316. Word line generator 338 receives the activated activation signal ACT at 316, the activated segment hit signal SEGHIT at 342, and the activated word line hit signal WLHIT at 344 and activates word line signals WL at 330. Segment control circuit 310 transmits a row activation signal to global row control circuit 304, which activates an internal timer to count up to a row address strobe time count. Memory cells are refreshed during the row address strobe time.

After the internal timer reaches the row address strobe time count, global row control circuit 304 deactivates refresh activation signal ACTRF at 314. Isolation timer 306 receives the deactivated refresh activation signal ACTRF at 314 and deactivates activation signal ACT at 316. Also, isolation timer 306 activates an internal timer that counts up to a post-conditioning time count.

Segment address decode circuit 332 receives the deactivated activation signal ACT at 316 and deactivates segment hit signal SEGHIT at 342. Also, word line address decode circuit 334 receives the deactivated activation signal ACT at 316 and deactivates word line hit signal WLHIT at 344. After the internal timer reaches the post-conditioning time count, isolation timer 306 deactivates isolation signal ISO at 318, which ends the refresh operation and substantially begins the idle state. Based on deactivation of isolation signal ISO at 318, segment address decode circuit 332 deactivates local isolation signal ISOLOC at 340. Sense amplifier control circuit 336 receives the deactivated activation signal ACT at 316, deactivated segment hit signal SEGHIT at 342, and deactivated local isolation signal ISOLOC at 340 and deactivates the left multiplexer control signals MUXL at 324 and right multiplexer control signals MUXR at 326 to isolate sense amplifiers in the idle state.

Figure 5:
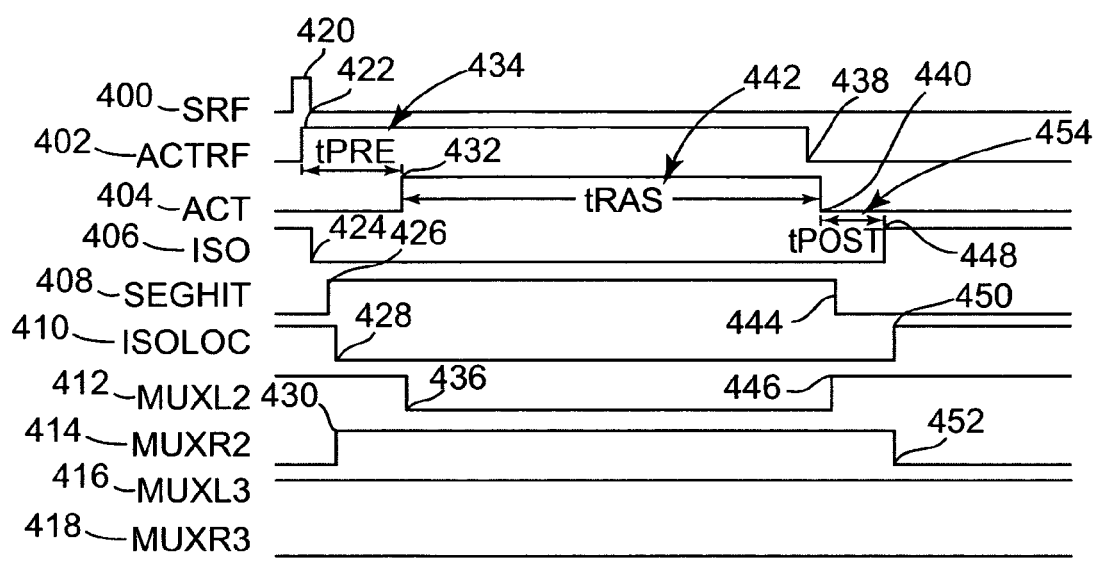
FIG. 5 is a timing diagram illustrating the operation of one embodiment of a row and sense amplifier control circuit.

FIG. 5 is a timing diagram illustrating the operation of one embodiment of row and sense amplifier control circuit 300. In this example, row and sense amplifier control circuit 300 corresponds to sub-array segment 2 at 202c (shown in FIG. 3). Sense circuit 2 at 204c is on one side of sub-array segment 2 at 202c and sense circuit 3 at 204d is on the other side of sub-array segment 2 at 202c.

In the idle state, self refresh timer 302 provides a low logic level in self refresh signal SRF at 400 and global row control circuit 304 provides a low logic level in refresh activation signal ACTRF at 402. Isolation timer 306 provides a low logic level in activation signal ACT at 404 and a high logic level in isolation signal ISO at 406. Segment address decode circuit 332 provides a low logic level in segment hit signal SEGHIT at 408 and a high logic level in local isolation signal ISOLOC at 410. Sense amplifier control circuit 336 provides an active high logic level in left multiplexer control signal of sense circuit 2 MUXL2 at 412 and a deactivated low logic level in right multiplexer control signal of sense circuit 2 MUXR2 at 414. Sense amplifier control circuit 336 provides an active high logic level in left multiplexer control signal of sense circuit 3 MUXL3 at 416 and a deactivated low logic level in right multiplexer control signal of sense circuit 3 MUXR3 at 418. Also, in the idle state, sense amplifier control circuit 336 provides sense amplifier control signals SACON at 328 to equalize and pre-charge bit lines in sub-array segments 202c.

In self-refresh mode, self refresh timer 302 provides a self refresh pulse at 420 in self refresh signal SRF at 400. Global row control circuit 304 receives the self refresh pulse 420 and provides an active high logic level at 422 in refresh activation signal ACTRF at 402. Isolation timer 306 receives the active high logic level at 422 in refresh activation signal ACTRF at 402 and provides an active low logic level at 424 in isolation signal ISO at 406. Also, isolation timer 306 activates an internal timer that counts up to a preconditioning time count. Refresh address counter 308 receives the active high logic level at 422 in refresh activation signal ACTRF at 402 and provides a refresh address RFADD at 320 that includes a block address portion and a word line address portion of a row address.

Segment address decode circuit 332 receives the active low logic level at 424 in isolation signal ISO at 406 and refresh address RFADD at 320. Segment address decode circuit 332 decodes the block portion of the row address in refresh address RFADD at 320. If the block portion addresses sub-array segment 202c, segment address decode circuit 332 provides an active high logic level at 426 in segment hit signal SEGHIT at 408. Based on the active low logic level at 424 in isolation signal ISO at 406 and the active high logic level at 426 in segment hit signal SEGHIT at 408, segment address decode circuit 332 provides an active low logic level at 428 in local isolation signal ISOLOC at 410. Also, word line address decode circuit 334 receives refresh address RFADD at 320 and decodes the word line portion of the row address in refresh address RFADD at 320 to provide an active word line hit signal WLHIT at 344.

Sense amplifier control circuit 336 receives the active low logic level at 428 in local isolation signal ISOLOC at 410 and the active high logic level at 426 in segment hit signal SEGHIT at 408 and provides an active high logic level at 430 in right multiplexer control signal of sense circuit 2 MUXR2 at 414. With the left multiplexer control signal of sense circuit 2 MUXL2 at 412 and the right multiplexer control signal of sense circuit 2 MUXR2 at 414 at active high logic levels, bit line voltages and differential inputs of sense amplifier 106 in sense circuit 2 at 204c are equalized to the bit line equalization voltage VBLEQ during the preconditioning time. Also, the left multiplexer control signal of sense circuit 3 MUXL3 at 412 is at an active high logic level to charge differential inputs of sense amplifier 106 in sense circuit 3 at 204d to the bit line equalization voltage VBLEQ during the idle state and preconditioning time.

After the internal timer reaches the preconditioning time count, isolation timer 306 provides an active high logic level at 432 in activation signal ACT at 404. The time between the transition to an active high logic level at 422 in refresh activation signal ACTRF at 402 and the transition to an active high logic level at 432 in activation signal ACT at 404 is preconditioning time tPRE at 434.

Sense amplifier control circuit 336 receives the active high logic level at 432 in activation signal ACT at 404 and provides a deactivated low logic level at 436 in left multiplexer control signal of sense circuit 2 MUXL2 at 412. The right multiplexer switch 108 in sense circuit 2 at 204c and the left multiplexer switch 104 in sense circuit 3 at 204d are activated to refresh memory cells in sub-array segment 202c. Word line generator 338 receives the active high logic level at 432 in activation signal ACT at 404, the active high logic level at 426 in segment hit signal SEGHIT at 408, and the activated word line hit signal WLHIT at 344 and activates word line signals WL at 330. Segment control circuit 310 transmits a row activation signal to global row control circuit 304, which activates an internal timer to count up to a row address strobe time count. Memory cells are refreshed during the row address strobe time.

After the internal timer reaches the row address strobe time count, global row control circuit 304 provides a deactivated low logic level at 438 in refresh activation signal ACTRF at 402. Isolation timer 306 receives the deactivated low logic level at 438 in refresh activation signal ACTRF at 402 and provides a deactivated low logic level at 440 in activation signal ACT at 404. The time between the transition to an active high logic level at 432 in activation signal ACT at 404 and the transition to a deactivated low logic level at 440 in activation signal ACT at 404 is the row address strobe time tRAS at 442. Also, isolation timer 306 activates an internal timer that counts up to a post-conditioning time count.

Segment address decode circuit 332 receives the deactivated low logic level at 440 in activation signal ACT at 404 and provides a deactivated low logic level at 444 in segment hit signal SEGHIT at 408. Also, word line address decode circuit 334 receives the deactivated low logic level at 440 in activation signal ACT at 404 and deactivates word line hit signal WLHIT at 344. Sense amplifier control circuit 336 receives the deactivated low logic level at 440 in activation signal ACT at 404 and deactivated low logic level 444 in segment hit signal SEGHIT at 408 and provides an active high logic level at 446 in left multiplexer control signal of sense circuit 2 MUXL2 at 412 to charge and equalize bit lines and differential inputs of sense amplifier 106 to the bit line equalization voltage VBLEQ prior to entering the idle state.

After the internal timer reaches the post-conditioning time count, isolation timer 306 provides a deactivated high logic level at 448 in isolation signal ISO at 406, which ends the refresh operation and substantially begins the idle state. The time between the transition to a deactivated low logic level at 440 in activation signal ACT at 404 and the transition to a deactivated high logic level at 448 in isolation signal ISO at 406 is post-conditioning time tPOST at 454. Based on the deactivated high logic level at 448 in isolation signal ISO at 406, segment address decode circuit 332 provides a deactivated high logic level at 450 in local isolation signal ISOLOC at 410 and sense amplifier control circuit 336 provides a deactivated low logic level at 452 in right multiplexer control signal of sense circuit 2 MUXR2 at 414 for the idle state.

DRAM 30 includes a row and sense amplifier control circuit, such as row and sense amplifier control circuit 300, which isolates bit lines from each other and from sense amplifiers during self refresh mode. During the idle state, row and sense amplifier control circuit 300 isolates one pair of bit lines from a second pair of bit lines. During a refresh operation, row and sense amplifier control circuit 300 connects only the set of bit lines associated with memory cells to be refreshed to sense amplifiers. Row and sense amplifier control circuit 300 controls isolation of bit lines to reduce standby leakage current due to word line to bit line shorts during the idle state and to maintain the standby current within current specifications.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A dynamic random access memory, comprising:
   a first dynamic random access memory cell;
   a second dynamic random access memory cell to be refreshed;
   a sense amplifier; and
   a control circuit configured to connect the sense amplifier to a first bit line associated with the first dynamic random access memory cell and to a second bit line associated with the second dynamic random access memory cell and to equalize bit line voltages and inputs of the sense amplifier to a bit line equalization voltage during a pre-conditioning time that is prior to a refresh time, wherein the control circuit is configured to isolate the first bit line from the sense amplifier and refresh the second dynamic random access memory cell during the refresh time.

2. The dynamic random access memory of claim 1, comprising:
   a first circuit coupled between the sense amplifier and the first dynamic random access memory cell; and
   a second circuit coupled between the sense amplifier and the second dynamic random access memory cell.

3. The dynamic random access memory of claim 2, wherein the first circuit is configured to isolate the sense amplifier from the first dynamic random access memory cell and the second circuit is configured to isolate the sense amplifier from the second dynamic random access memory cell.

4. The dynamic random access memory of claim 1, wherein the control circuit is configured to connect the sense amplifier to the first bit line and isolate the sense amplifier from the second bit line in an idle time that is prior to the pre-conditioning time.

5. The dynamic random access memory of claim 1, wherein the control circuit is configured to connect the first bit line to the sense amplifier and to equalize the bit line voltages and the inputs of the sense amplifier to the bit line equalization voltage during a post-conditioning time that follows the refresh time.

6. The dynamic random access memory of claim 5, wherein the control circuit is configured to isolate the sense amplifier from the second bit line in an idle time that follows the post-conditioning time.

7. A dynamic random access memory, comprising:
   a first segment of first dynamic random access memory cells including first bit lines;
   a second segment of second dynamic random access memory cells including second bit lines;
   sense amplifiers;
   a first circuit configured to isolate the sense amplifiers from the first bit lines;
   a second circuit configured to isolate the sense amplifiers from the second bit lines; and
   a control circuit configured to connect the sense amplifiers via the first circuit to the first bit lines and via the second circuit to the second bit lines and to equalize bit line voltages and inputs of the sense amplifiers to a bit line equalization voltage during a pre-conditioning time that is prior to a refresh time, wherein the control circuit is configured to isolate the first bit lines from the sense amplifiers and to refresh the second segment of dynamic random access memory cells during the refresh time.

8. The dynamic random access memory of claim 7, wherein the control circuit is configured to connect the sense amplifiers to the first bit lines via the first circuit and isolate the sense amplifiers from the second bit lines via the second circuit in an idle time that is prior to the pre-conditioning time.

9. The dynamic random access memory of claim 7, wherein the control circuit is configured to connect the sense amplifiers to the first bit lines via the first circuit and to equalize the bit line voltages and the inputs of the sense amplifiers to the bit line equalization voltage during a post conditioning time that follows the refresh time.

10. A dynamic random access memory, comprising:
first dynamic random access memory cells;
second dynamic random access memory cells;
a sense amplifier;
a first pre-charge circuit configured to pre-charge first bit lines corresponding to the first dynamic random access memory cells;
a second pre-charge circuit configured to pre-charge second bit lines corresponding to the second dynamic random access memory cells;
a first isolation circuit configured to isolate the sense amplifier from the first pre-charge circuit;
a second isolation circuit configured to isolate the sense amplifier from the second pre-charge circuit; and
a control circuit configured to connect the sense amplifier to the first pre-charge circuit via the first isolation circuit and the second pre-charge circuit via the second isolation circuit and equalize bit line voltages and inputs of the sense amplifier to a bit line equalization voltage during a pre-conditioning time that is prior to a refresh time, wherein the control circuit is configured to isolate the first pre-charge circuit from the sense amplifier and to refresh the second dynamic random access memory cells during the refresh time.

11. The dynamic random access memory of claim 10, wherein the control circuit is configured to connect the sense amplifier to the first pre-charge circuit via the first isolation circuit and isolate the sense amplifier from the second pre-charge circuit via the second isolation circuit in an idle time that is prior to the pre-conditioning time.

12. The dynamic random access memory of claim 10, wherein the control circuit is configured to connect the sense amplifier to the first pre-charge circuit via the first isolation circuit and to equalize the bit line voltages and the inputs of the sense amplifier to the bit line equalization voltage during a post conditioning time that follows the refresh time.

13. A dynamic random access memory, comprising:
means for connecting sense amplifiers to first bit lines associated with first dynamic random access memory cells during a pre-conditioning time that is prior to a refresh time;
means for connecting the sense amplifiers to second bit lines associated with second dynamic random access memory cells during the pre-conditioning time;
means for equalizing bit line voltages and inputs of the sense amplifiers to a bit line equalization voltage during the pre-conditioning time;
means for isolating the first bit lines from the sense amplifiers during the refresh time; and
means for refreshing the second dynamic random access memory cells during the refresh time.

14. The dynamic random access memory of claim 13, comprising:
means for isolating the sense amplifiers from the second bit lines in an idle time that is prior to the pre-conditioning time.

15. The dynamic random access memory of claim 13, comprising:
means for connecting the sense amplifiers to the first bit lines during a post-conditioning time that follows the refresh time; and
means for equalizing the bit line voltages and the inputs of the sense amplifiers to the bit line equalization voltage during the post-conditioning time.

16. The dynamic random access memory of claim 15, comprising:
means for isolating the sense amplifiers from the second bit lines in an idle time that follows the post-conditioning time.

17. A method for refreshing dynamic random access memory cells comprising:
connecting sense amplifiers to first bit lines associated with first dynamic random access memory cells during a pre-conditioning time that is prior to a refresh time;
connecting the sense amplifiers to second bit lines associated with second dynamic random access memory cells during the pre-conditioning time;
equalizing bit line voltages and inputs of the sense amplifiers to a bit line equalization voltage during the pre-conditioning time;
isolating the first bit lines from the sense amplifiers during the refresh time; and
refreshing the second dynamic random access memory cells during the refresh time.

18. The method of claim 17, comprising:
isolating the sense amplifiers from the second bit lines in an idle time that is prior to the pre-conditioning time.

19. The method of claim 17, comprising:
connecting the sense amplifiers to the first bit lines during a post-conditioning time that follows the refresh time; and
equalizing the bit line voltages and the inputs of the sense amplifiers to the bit line equalization voltage during the post-conditioning time.

20. The method of claim 19, comprising:
isolating the sense amplifiers from the second bit lines in an idle time that follows the post-conditioning time.

* * * * *